(12) United States Patent
Kramer (10) Patent No.: US 9,312,142 B2
(45) Date of Patent: Apr. 12, 2016

(54) CHEMICAL MECHANICAL POLISHING METHOD AND APPARATUS

(71) Applicant: GLOBALFOUNDRIES Inc., Grand Cayman (KY)

(72) Inventor: Jens Kramer, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/300,705

(22) Filed: Jun. 10, 2014

(65) Prior Publication Data
US 2015/0357199 A1    Dec. 10, 2015

(51) Int. Cl.
*H01L 21/306* (2006.01)
*B24B 53/017* (2012.01)
*H01L 21/67* (2006.01)

(52) U.S. Cl.
CPC ........ *H01L 21/30625* (2013.01); *B24B 53/017* (2013.01); *H01L 21/67075* (2013.01); *H01L 21/67092* (2013.01)

(58) Field of Classification Search
CPC .............. H01L 21/30625; H01L 21/67075
See application file for complete search history.

(56) References Cited

U.S. PATENT DOCUMENTS

| 5,823,854 | A | 10/1998 | Chen | |
| 5,913,713 | A | 6/1999 | Cheek et al. | |
| 6,332,832 | B1 | 12/2001 | Suzuki | |
| 2002/0106971 | A1 | 8/2002 | Rodriquez et al. | |
| 2005/0186891 | A1* | 8/2005 | Benner | B24B 53/017 451/56 |
| 2006/0270237 | A1 | 11/2006 | Chuang et al. | |
| 2012/0220195 | A1 | 8/2012 | Gawase et al. | |
| 2014/0273763 | A1* | 9/2014 | Lee | B24B 53/003 451/56 |

FOREIGN PATENT DOCUMENTS

DE    10324429 B4    8/2010

OTHER PUBLICATIONS

Araca, Inc.,"Slurry Injector System (SIS) by Araca, Inc.", 2 pages.

* cited by examiner

*Primary Examiner* — Duy Deo
*Assistant Examiner* — Mahmoud Dahimene
(74) *Attorney, Agent, or Firm* — Ditthavong & Steiner, P.C.

(57) ABSTRACT

Methods for polishing a semiconductor wafer using a pad resurfacing arm and an apparatus therefor are disclosed. Embodiments may include providing a semiconductor wafer on a chemical mechanical polishing (CMP) tool, the CMP tool including a polish pad and a pad resurfacing arm which includes a pad cleaning part, a pad conditioning part, and a slurry dispensing part, dispensing a slurry to the polish pad utilizing the pad resurfacing arm, and polishing the semiconductor wafer utilizing the polish pad.

8 Claims, 5 Drawing Sheets

CHEMICAL MECHANICAL POLISHING METHOD AND APPARATUS

TECHNICAL FIELD

The present disclosure relates to chemical mechanical polishing (CMP) of semiconductor wafers utilizing a polish pad. The present disclosure is particularly applicable to preparing and/or resurfacing polish pads utilized in CMP of semiconductor wafers for the 22 nanometer (nm) technology node and beyond.

BACKGROUND

CMP is often utilized for planarizing semiconductor wafer surfaces in the fabrication of integrated circuits. Such CMP processes typically involve rubbing the surface of the wafer against a polishing device to remove high spots on the wafer surface. The wafer is held in a stationary or rotating fixture while being pressed against a stationary or rotating polishing pad. Generally, at least one of the pad and the arm are moving with respect to each other to create friction between the pad and wafer for polishing the wafer. The polishing pad is supported on a platen which may be rotated during the CMP process. The polishing surface of the polishing pad may be constructed from a variety of materials, such as open-cell foam polyurethane or a sheet of polyurethane with a grooved surface. The polishing surface is relatively rough in comparison to the semiconductor wafer surface. A slurry of polishing fluid is often introduced to further aid in the CMP process.

The surface of the polishing pad gradually becomes glazed due to the accumulation of material removed during the polishing process. Accordingly, the pad must be periodically conditioned to restore its rough surface texture. Such conditioning involves the application of an abrasive surface of a conditioning device against the surface of the polishing pad to remove the accumulated debris, and it may remove a portion of the polishing pad surface itself. Conditioning will expose a renewed polishing pad surface having characteristics essentially the same as or similar to a new pad. Commonly, a polishing pad is conditioned after each semiconductor wafer is polished.

Several types of conditioning devices are known in the art, for example a conditioning disk having a diamond abrasive surface formed thereon. The abrasive surface is rubbed against the polishing pad surface at a predetermined velocity, for a predetermined length of time, with a predetermined amount of force exerted between. The abrasive diamond surface functions to condition or roughen the surface of the polishing pad. The amount of conditioning may be varied by changing the velocity, time of contact, or force between the conditioning device and the polishing pad. For instance, the amount of conditioning will increase with an increased velocity, a lengthened time period, or an increased force between the two surfaces.

Too much or too little conditioning will provide undesirable results. CMP specifications are tightening as the semiconductor industry progresses to manufacturing semiconductor wafers at smaller technology nodes, such as 22 nm and 14 nm nodes. Polish pad resurfacing and preparation processes, such as slurry distribution, are being developed for manufacturing at smaller technology nodes and 450 mm wafers. Controlled conditioning of a polish pad in CMP is commonly utilized to create more consistent polish conditions throughout a CMP usability lifetime of a polish pad.

Current polish pad resurfacing and preparation processes have several limitations and drawbacks. One limitation is that a polish pad is often not prepared and/or resurfaced consistently over the whole surface of the pad. For example, a polish pad is often conditioned utilizing a rotating conditioning disc on a conditioning arm moving at differential sweeping motions and speeds to resurface the polish pad. The sweep speed is often zero at points where the sweeping motion is reversed. Alternatively, it may be elevated at other locations of a sweeping motion, such as at a periphery of a "donut" hole at the center of an orbital sweeping motion. The differential sweeping motions and speeds commonly result in differential removal rates of the unconditioned pad at turning points of the sweeping motion and at areas of the pad conditioned at higher sweeping speeds.

Another limitation is that conditioning arms currently utilized in polish pad resurfacing and preparation processes often do not provide for control or measurement of dynamic or differential downward forces applied to the polish pad through the arms. Instead, downward forces that are unitary and static in nature are commonly applied through the arms via a pneumatic system. Often the unitary static downward forces applied through the arms are difficult to measure, such as by utilizing a load cell.

Another limitation is that arms currently utilized in polish pad resurfacing and preparation processes, such as a conditioning arm, are often mechanically unstable due to the high wearing out of bearings and other mechanical parts associated with moving the arms. Another limitation is that separate mechanical parts are required for pad conditioning and pad cleaning. A conditioning arm generally has no cleaning capability for cleaning a polish pad. Similarly, a cleaning arm or other means for cleaning a polish pad, such as an atomizer, generally has no pad conditioning capability.

A need therefore exists for methodology enabling (1) consistent preparation and/or resurfacing over a whole surface of a polish pad in a CMP tool, (2) control and/or measurement of dynamic and/or differential downward forces applied to a polish pad in a CMP tool, (3) mechanical stability regarding mechanical parts utilized in a CMP tool and (4) a reduction in the number of separate mechanical parts in a CMP tool utilized for preparing and/or resurfacing a polish pad in a CMP process, and an apparatus therefore.

SUMMARY

An aspect of the present disclosure includes a method including providing a pad resurfacing arm including a pad cleaning part, a pad conditioning part, and a slurry dispensing part.

Another aspect of the present disclosure includes an apparatus including a pad resurfacing arm including a pad cleaning part, a pad conditioning part, and a slurry dispensing part.

Additional aspects and other features of the present disclosure will be set forth in the description which follows and, in part, may be apparent to those having ordinary skill in the art upon examination of the following or may be learned from the practice of the present disclosure. Advantages of the present disclosure may be realized and obtained as particularly pointed out in the appended claims.

According to the present disclosure, some technical effects may be achieved, in part, by a method including providing a semiconductor wafer on a CMP tool, the CMP tool including a polish pad, and a pad resurfacing arm. Another aspect includes a pad cleaning part, a pad conditioning part, and a slurry dispensing part in a method, the method further including dispensing slurry to the polish pad utilizing the pad resurfacing arm, and polishing the semiconductor wafer utilizing the polish pad.

Another aspect includes conditioning the polish pad, utilizing the pad resurfacing arm. Yet another aspect includes cleaning the polish pad, utilizing the pad resurfacing arm. Other aspects include conditioning the polish pad, utilizing the pad resurfacing arm, and cleaning the polish pad, utilizing the pad resurfacing arm. A further aspect includes utilizing the pad resurfacing arm by rotating the pad resurfacing arm. An additional aspect includes the pad resurfacing arm being cylindrical. Yet another aspect includes the pad resurfacing arm being conical. Still another aspect includes utilizing the pad resurfacing arm by sliding the pad resurfacing arm on the polish pad. A further aspect includes the pad resurfacing arm including guides of a plastic material. An additional aspect includes utilizing the pad resurfacing arm by applying different levels of force to the polish pad from different locations of the pad resurfacing arm.

Another aspect of the present disclosure includes an apparatus including a CMP tool, the CMP tool including a polish pad and a pad resurfacing arm, which includes a pad cleaning part, a pad conditioning part, and a slurry dispensing part.

Another aspect includes the CMP tool being configured to rotate the pad resurfacing arm. Yet another aspect includes the CMP tool being configured to sweep the pad resurfacing arm over the polish pad. Still another aspect includes the apparatus including a flatness monitoring arm. An additional aspect includes the pad resurfacing arm being cylindrical. Yet another aspect includes the pad resurfacing arm being conical. A further aspect includes the CMP tool being configured to slide the pad resurfacing arm on the polish pad. Another aspect includes the pad resurfacing arm including guides of a plastic material. Yet another aspect includes the CMP tool being configured to apply different levels of force to the polish pad from different locations of the pad resurfacing arm. A further aspect includes the CMP tool being configured to rotate the pad resurfacing arm on the polish pad. Yet another aspect includes the CMP tool being configured to rotate the pad resurfacing arm, vertically, on the polish pad.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem(s) of (1) inconsistent preparation and/or resurfacing over a whole surface of a polish pad in a CMP tool, (2) lack of control and/or measurement of dynamic and/or differential downward forces applied to a polish pad in a CMP tool, (3) mechanical instability regarding mechanical parts utilized in a CMP tool and (4) a large number of mechanical parts in a CMP tool utilized for preparing and/or resurfacing a polish pad in a CMP process. In accordance with embodiments of the present disclosure, a process uses a CMP tool including a polish pad and a pad resurfacing arm, the pad resurfacing arm including a pad cleaning part, a pad conditioning part, and a slurry dispensing part.

Methodology in accordance with embodiments of the present disclosure may include providing a semiconductor wafer on a CMP tool, the CMP tool including a polish pad, and a pad resurfacing arm including a pad cleaning part, a pad conditioning part, and a slurry dispensing part. A slurry is dispensed to the polish pad utilizing the pad resurfacing arm. Then, the semiconductor wafer is polished utilizing the polish pad.

Still other aspects, features, and technical effects will be readily apparent to those skilled in the art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
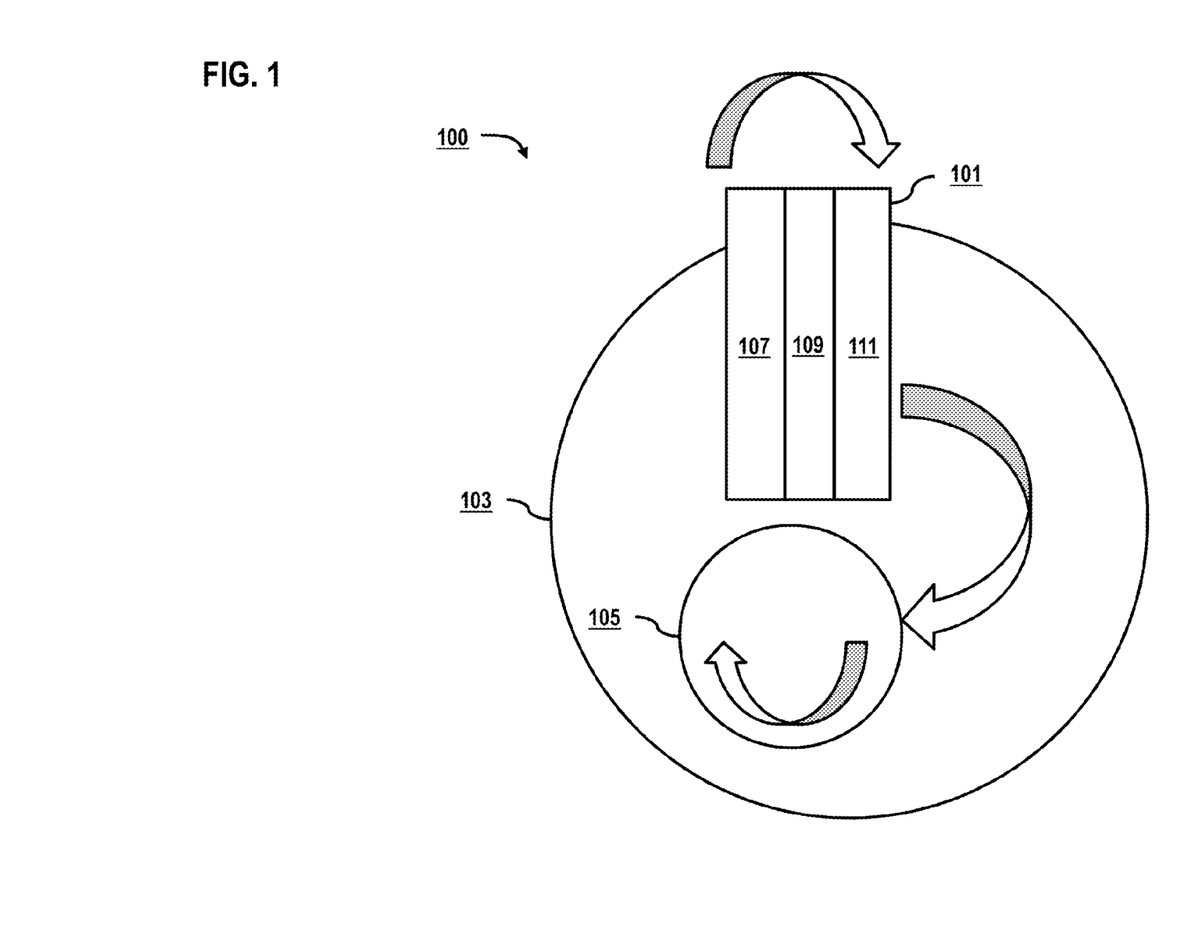
FIG. 1 schematically illustrates a top view of a CMP tool, in accordance with an exemplary embodiment.

Adverting to FIG. 1, in accordance with an exemplary embodiment, a top-down view of a CMP tool 100 is illustrated including a pad resurfacing arm 101 on a polish pad 103 resting upon a platen (not shown) below the polish pad 103. The CMP tool 100 also includes a wafer holder 105, which may be rotating or stationary (illustrated as rotating), holding a semiconductor wafer below (not shown) in contact with polish pad 103, which may be rotating or stationary, under the semiconductor wafer. The pad resurfacing arm 101 is movable or stationary over the polish pad 103. In general, at least one of the pad 103 and the arm 101 are moving with respect to each other to generate friction between the pad 103 and a wafer. As depicted in FIG. 1, the length of arm 101 extends from the outer periphery of polish pad 103 and across the center of the polish pad 103. The arm 101 may slide and rotate in such a manner that the whole surface of the polish pad 103 is cleaned, conditioned or dispensed slurry by the arm 101.

The arm 101 may rotate in place, or slide in different directions over the polish pad 103, such as in an arc movement or an orbital movement over a partial or a whole surface of the polish pad 103. The pad resurfacing arm 101 may be constructed of various materials, such as metal (e.g., aluminum), metal alloy (e.g., steel) and may include guides, for sliding on the polish pad 103, made with a lightweight material, such as a plastic material (e.g., thermoplastic polymers such as polyether ether ketone (i.e., PEEK), poly-p-phenylene sulfide (i.e. PPS), and silicon carbide (i.e., SiC)). The pad resurfacing arm 101 may utilize a variety of structural variations and may be, for example, cylindrical and/or conical, or in a box structure in the CMP tool 100 covering partially or fully a surface of the polish pad 103.

The pad resurfacing arm 101 includes a pad cleaning part 107, such as an atomizer or a spray nozzle for delivering a cleaning fluid under high pressure, such as distilled or ultrapurified water treated with nitrogen gas, to the polish pad 103. The pad resurfacing arm 101 also includes a pad conditioning part 109, which may be made from hard materials such as diamond or silicon carbide peaks to form an abrasive surface which may include, for example, a rotating or oscillating surface of the arm 101, an internal disc or other mechanism for applying motion to the abrasive surface of pad conditioning part 109 with respect to the polish pad 103. The pad resurfacing arm 101 also includes a slurry dispensing part 111 for dispensing polishing slurry to the polish pad for polishing the semiconductor wafer. The slurry dispensing part 111 includes one or more slurry outlets, for example five outlets, for dispensing slurry to the polish pad. The outlets may be fixed or movable on the slurry dispensing part 111.

Figure 2:
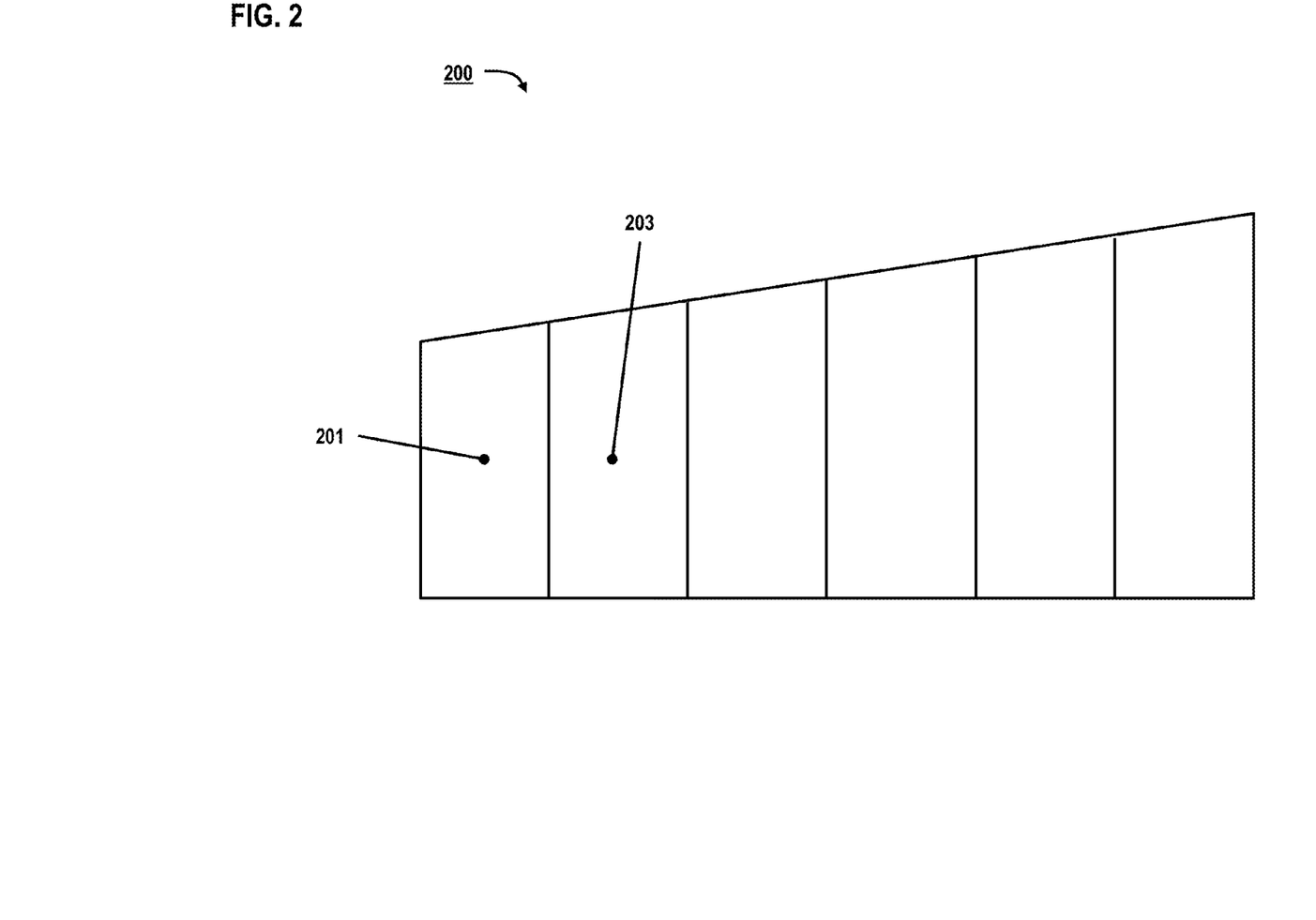
FIG. 2 schematically illustrates a side view of a pad resurfacing arm, in accordance with an exemplary embodiment.

Adverting to FIG. 2, in accordance with an exemplary embodiment, a side view of a pad resurfacing arm 200 is illustrated. The pad resurfacing arm 200 is conical in shape and includes different locations, such as location 201 and 203 through which different levels of force may be applied to a polish pad for purposes such as conditioning and/or cleaning. The local forces may be controlled using local implementation of the force, such as by a load cell for each location on the arm utilizing a strain gauge attuned for each load cell. The load cells or other implementation may utilize a variety of power sources, including, but not limited to, magnetic levitation, an electric motor, pneumatic pressure, and mechanical drives.

Figure 3:
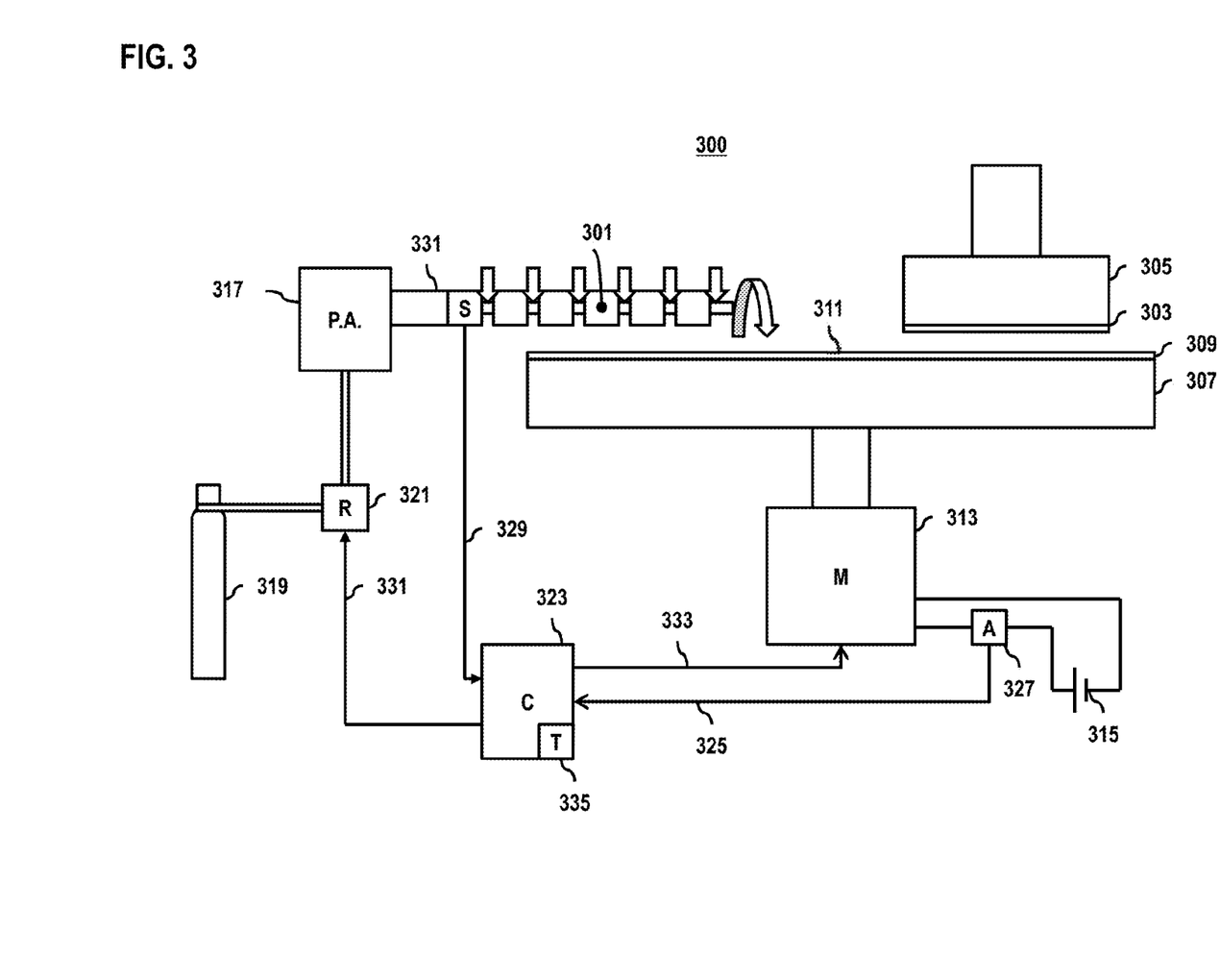
FIG. 3 schematically illustrates a side view of a CMP tool, in accordance with an exemplary embodiment.

Adverting to FIG. 3, in accordance with an exemplary embodiment, a CMP tool 300 includes a pad resurfacing arm 301 that may be, for example, cylindrical in shape. FIG. 3 illustrates the whole arm 301 rotating, but with differential downward forces as depicted by the separate downward arrows at different locations of the arm. A semiconductor wafer 303 may be held in a wafer holder 305 (stationary or rotating) which may be moved against or into contact with a platen 307 covered with a polishing pad 309. The platen 307 may be rotated by a motor 313 connected to a power supply 315. The polish pad surface 311 of the polishing pad 309 receives a slurry dispensed from the pad resurfacing arm 301 for polishing the semiconductor wafer 303. Also, at least periodically, the pad resurfacing arm cleans debris from the polish pad surface 311, such as by spraying or atomizing the polish pad surface 311 with a cleaning fluid, and/or conditions the polish pad 309 to retain a desired level of roughness in the polish pad surface 311. To accomplish the dispensing of slurry, conditioning, and cleaning, the pad resurfacing arm 101 includes a part for each of these functions such as described above with respect to FIG. 1.

Pad resurfacing arm 301 is illustrated schematically as being connected to a pneumatic actuator 317 for providing horizontal and vertical movement of the arm 301, as well as for providing a selected amount of force between the arm 301 and the polishing pad surface 311 during, for example, a conditioning operation. Pneumatic actuator 317 may be powered by a source of compressed gas 319 controlled by regulator 321. The resurfacing arm 301 may alternatively include a device powered by magnetic levitation, an electric motor, and other mechanical drives for arm 301, which may have one or more separately rotatable abrasive surfaces, an abrasive surface formed on a conditioning wheel, or other such variations as may be known in the art.

It is known that the conditioning performance of the resurfacing arm 301 is a function of the relative velocity between an abrasive surface on the arm 301 and the surface 311 of the polishing pad 309. It is also known that the conditioning performance is a function of the compressive force between these two surfaces, and a function of the length of time that the two surfaces remain in contact. Furthermore, the conditioning performance is a function of the roughness of the abrasive surface on the arm 301. The conditioning performance will increase as the velocity between the surfaces is increased, as the compressive force between the surfaces is increased, and as the length of time of contact between the surfaces is increased.

The CMP tool 300 with the pad resurfacing arm 301 of FIG. 3 includes a controller 323 adapted to control the cleaning, conditioning, and dispensing of slurry in a manner sufficient to provide for these functions over a desired area of the polish pad surface 311. Controller 323 may be a microprocessor or any sort of electromechanical device known in the art for controlling a process. Controller 323 receives as an input a signal 325 from an ampere meter 327 associated with the power supply 315 and motor 313. Ampere meter 327 is adapted to measure the power being supplied to motor 313 and to produce a corresponding signal 325. Motor 313 may be powered by another energy source, such as a pneumatic motor powered by compressed gas, in which case an appropriate equivalent sensor may be provided in lieu of ampere meter 327 for measuring the power or rate of energy delivery to such motor.

In addition to signal 325, or as an alternative thereto, controller 323 may receive one or more input signals 329 from one or more strain gauges 331 attached to resurfacing arm 301 or other structure connected to the resurfacing arm 301. The one or more strain gauges 331 are adapted to measure the deflections of arm 301 at different locations in the arm caused by the friction forces generated between the one or more locations of arm 301 and polish pad surface 311. Both signals 325, 329 correspond in magnitude to the friction forces generated between the polish pad surface 311 and locations of the resurfacing arm 301. As a friction force increases, the amount of deflection at a location of arm 301 increases, as well as the amount of power that must be supplied to motor 313 in order to maintain a selected rotation or other movement speed of arm 301 on polish pad 309. Accordingly, as the conditioning performance of the resurfacing arm 301 changes as a result of uses of an abrasive surface of the resurfacing arm 301 or other conditions of polish pad 309, such as a need for cleaning a corresponding change in signals 325, 329 is realized.

In order to modify the conditioning, slurry dispensing, and/or cleaning to account for a change in the polish pad surface 311, such as slurry buildup, or conditioning needed in a specific area of the polish pad surface 311, controller 323 may be programmed to provide signals necessary to control one or more variables, such as the velocity and/or rotational movement between polish pad surface 311 and resurfacing arm 301, the selected movement direction(s), the length of time of the cleaning, conditioning and/or slurry dispensing operations, and the compressive force between the polish pad surface 311 and the resurfacing arm 301. To accomplish such control, controller 323 may generate a control signal 331 connected to regulator 321 to control the amount of down force applied between the resurfacing arm 301 and the polishing pad 309 by pneumatic actuator 317. Controller 323 may also or alternatively provide a control signal 333 connected to motor 313 to control the speed of operation of motor 313. Furthermore, controller 323 may include an internal or external timer 335 associated with output signals 331, 333 for controlling the duration of conditioning, cleaning and slurry dispensing operations by the resurfacing arm 301, for example in response to signals from a conventional flatness monitoring arm (not shown for illustrative convenience).

Figure 4:
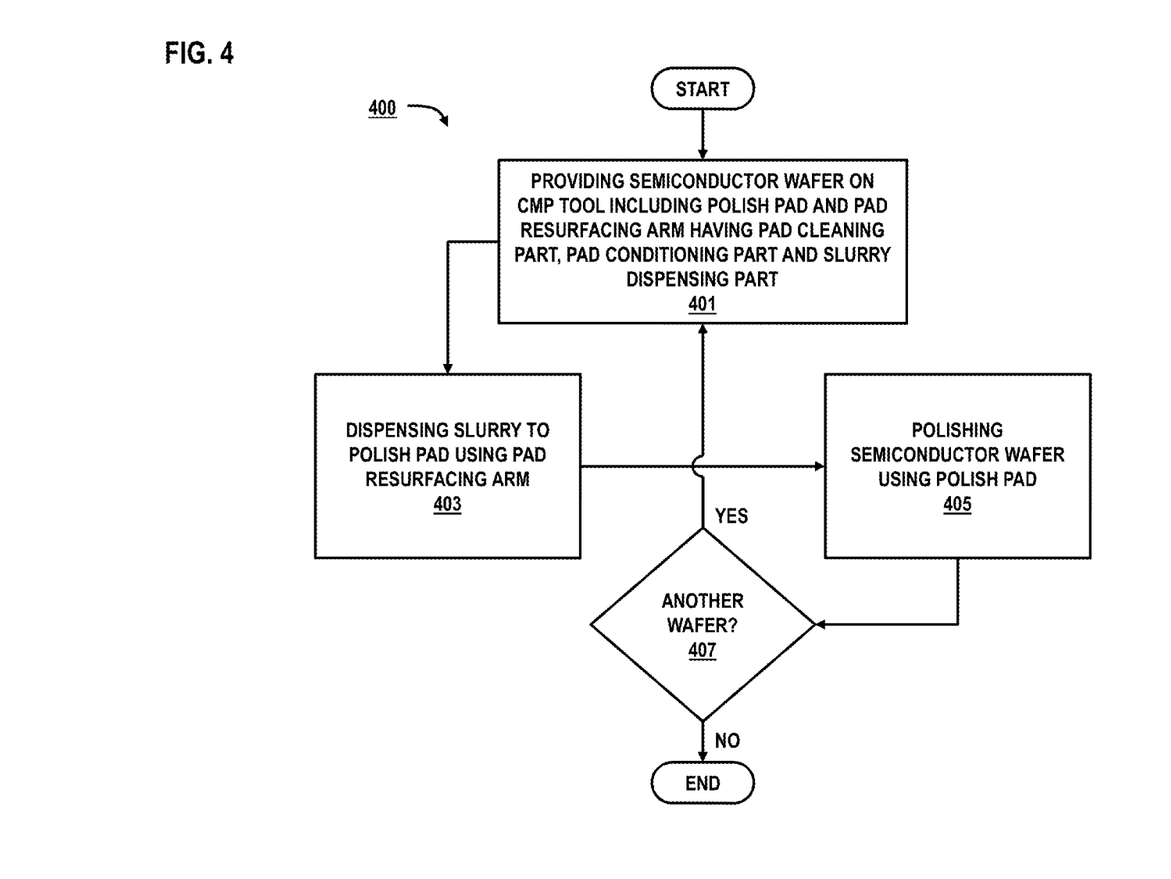
FIG. 4 schematically illustrates a process flow for polishing a semiconductor wafer, in accordance with an exemplary embodiment.

Adverting to FIG. 4, a process 400 is illustrated which may be utilized for polishing a semiconductor utilizing CMP tool 100, according to an exemplary embodiment. The steps of process 400, and other methods described herein, are described by way of example with the CMP tool 100.

After process start, at step 401, a semiconductor wafer is provided on the CMP tool 100, including polish pad 103 and pad resurfacing arm 101. The pad resurfacing arm 101 includes the pad cleaning part 107, the pad conditioning part 109, and the slurry dispensing part 111. The CMP tool 100 also includes holder 105 holding the semiconductor wafer on the polish pad 103.

At step 403, the slurry dispensing part 111 in the pad resurfacing arm 101 dispenses slurry to the polish pad 103, such as for polishing the semiconductor wafer which is held in the wafer holder 105.

At step 405, CMP tool 100 is utilized to polish the semiconductor wafer held in the wafer holder 105 by moving the semiconductor wafer while in contact with the polish pad 103. The wafer may be moved over the polish pad in various ways, such as by rotating the wafer holder 105, or rotating the polish pad 103 under the wafer, or combinations thereof.

Once the wafer has been polished sufficiently, if, at 407, another wafer is to be planarized, the process 400 may begin again at step 401. Otherwise, after 407, the process ends. Although shown as requiring a slurry dispensing step prior to polishing for each wafer, it is possible to reuse a slurry for polishing multiple wafers rather than dispensing slurry for each wafer.

Figure 5:
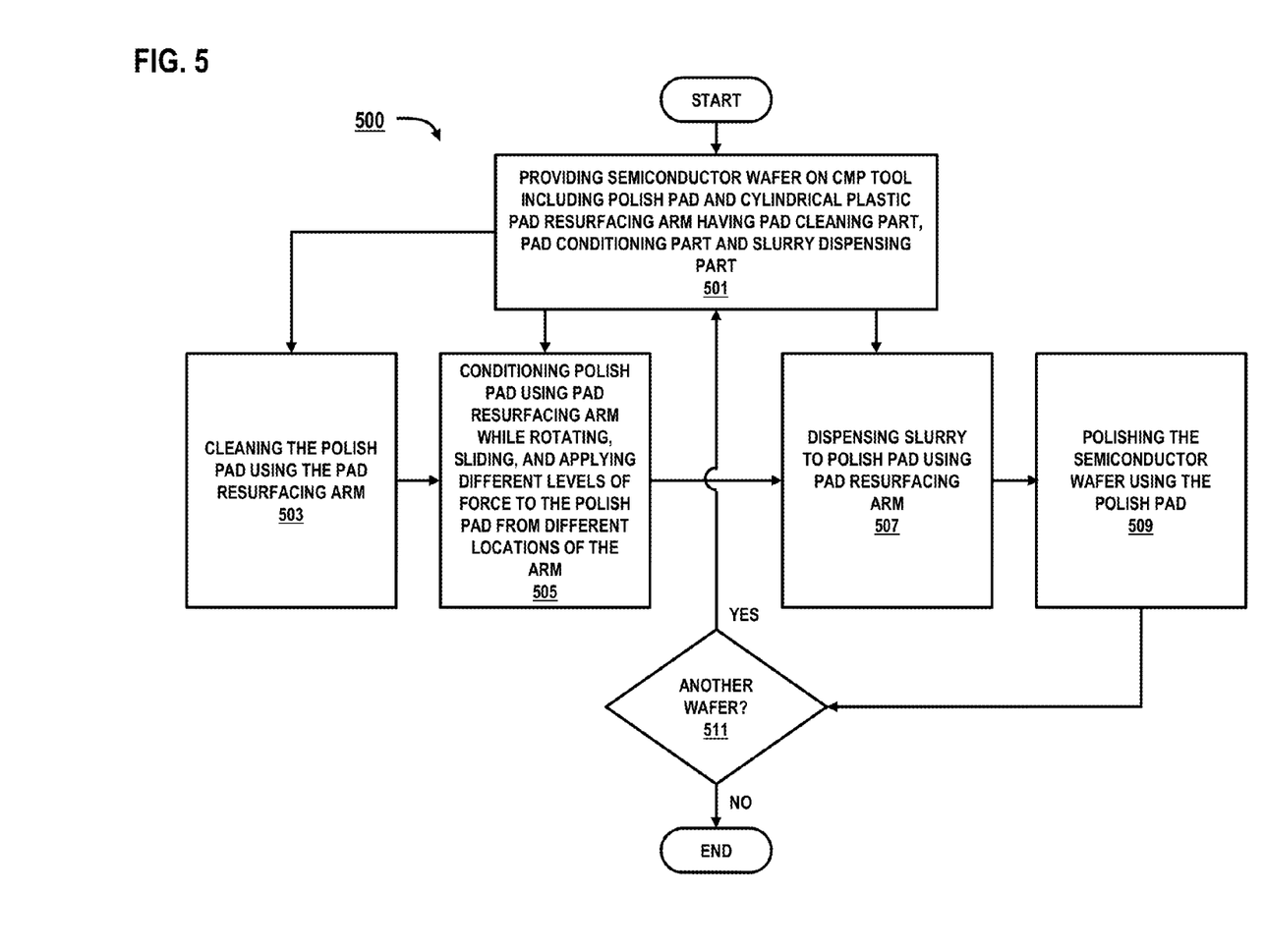
FIG. 5 schematically illustrates a process flow for polishing a semiconductor wafer, in accordance with an exemplary embodiment.

Adverting to FIG. 5, an expanded process 500 is illustrated which may be utilized for polishing a semiconductor utilizing CMP tool 100, according to an exemplary embodiment.

After process start, at step 501, a semiconductor wafer is provided on the CMP tool 100, including polish pad 103 and pad resurfacing arm 101. The pad resurfacing arm 101 is cylindrical in shape and include guides made of a plastic, such as PEEK or PPS, and a hard conditioning material, such as a silicon carbide material. The arm 101 includes pad cleaning part 107, pad conditioning part 109, and slurry dispensing part 111. The CMP tool 100 also includes wafer holder 105 holding the semiconductor wafer on the polish pad 103.

At step 503, the pad cleaning part 107 of the pad resurfacing arm 101 is utilized to clean the polish pad 103, such as by spraying cleaning fluid on a surface of the polish pad 103 utilizing an atomizer within the pad cleaning part 107. Pad cleaning step 503 may be performed in-situ or ex-situ. As indicated in FIG. 5, pad cleaning step 503 may be omitted for one or more wafers. However, if it is desired that wafers be polished with equivalent conditions, according to an example, the cleaning step is preferably not omitted. The pad cleaning 503 is followed by a pad conditioning step 505. However, the pad cleaning and the pad conditioning may occur in reverse order or may overlap or coincide, for example, provided that water from the pad cleaning is removed before dispensing a slurry for polishing the wafer. According to an example, it is possible to reuse the slurry for additional wafers, such as, for example, when pad cleaning is not done.

At step 505, the pad conditioning part 109 of the pad resurfacing arm 101 is utilized to condition the polish pad 103 while rotating and sliding the arm 101 and/or applying different levels of force to the polish pad 103 from different locations of the arm 101. As indicated in FIG. 5, if no pad cleaning step is utilized, pad conditioning step 505 may also be omitted for one or more wafers. However, again for all wafers to be polished with the same conditions, the conditioning step should not be omitted. When step 505 is utilized, the polish pad 103 is conditioned in a pad conditioning step 505 followed by a slurry dispensing step 507.

At step 507, the slurry dispensing part 111 in the pad resurfacing arm 101 dispenses slurry to the polish pad 103, for polishing the semiconductor wafer which is held in the wafer holder 105. Although shown as separate steps in FIG. 5, pad conditioning step 505 and slurry dispensing step 507 may occur together.

At step 509, CMP tool 100 is utilized to polish the semiconductor wafer held in the wafer holder 105 by moving the semiconductor wafer while in contact with the slurry and the polish pad 103. The wafer may be moved over the polish pad in various ways, such as by rotating the wafer holder 105, or rotating the polish pad 103 under the wafer, or combinations thereof.

Once the wafer has been polished sufficiently, if, at 511, another wafer is to be planarized, the process 500 may begin again at step 501. Otherwise, at 511, the process ends.

The embodiments of the present disclosure can achieve several technical effects, such as (1) consistent preparation and/or resurfacing over a whole surface of a polish pad in a CMP tool, (2) control and/or measurement of dynamic and/or differential downward forces applied to a polish pad in a CMP tool, (3) mechanical stability regarding mechanical parts utilized in a CMP tool and (4) a reduction of mechanical parts in a CMP tool utilized for preparing and/or resurfacing a polish pad in a CMP process. The present disclosure enjoys industrial applicability in any of the semiconductor arts. For example, the present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a semiconductor wafer on a chemical mechanical polishing (CMP) tool, the CMP tool comprising:
      a polish pad, and a pad resurfacing arm having a cylindrical or conical shape with a length extending from an outer periphery of the polish pad and across a center of the polish pad, the pad resurfacing arm comprising:
a pad cleaning part,
a pad conditioning part, and
a slurry dispensing part;
dispensing a slurry to the polish pad utilizing the pad resurfacing arm; and
polishing the semiconductor wafer utilizing the polish pad by rotating the pad resurfacing arm.

2. The method according to claim 1, further comprising:
conditioning the polish pad, utilizing the pad resurfacing arm.

3. The method according to claim 1, further comprising:
cleaning the polish pad, utilizing the pad resurfacing arm.

4. The method according to claim 1, further comprising:
conditioning the polish pad, utilizing the pad resurfacing arm; and
cleaning the polish pad, utilizing the pad resurfacing arm.

5. The method according to claim 1, wherein utilizing the pad resurfacing arm comprises sliding the pad resurfacing arm on the polish pad.

6. The method according to claim 1, wherein the pad resurfacing arm comprises guides of a plastic material.

7. The method according to claim 1, wherein utilizing the pad resurfacing arm comprises applying different levels of force to the polish pad from different locations of the pad resurfacing arm.

8. A method comprising:
providing a semiconductor wafer on a chemical mechanical polishing (CMP) tool, the CMP tool comprising:
a polish pad, and
a cylindrical pad resurfacing arm comprising guides of a plastic material and having a length extending from an outer periphery of the polish pad and across a center of the polish pad, the pad resurfacing arm further comprising:
a pad cleaning part,
a pad conditioning part, and
a slurry dispensing part;
cleaning the polish pad, utilizing the pad resurfacing arm;
conditioning the polish pad, utilizing the pad resurfacing arm;
dispensing a slurry to the polish pad, utilizing the pad resurfacing arm; and
polishing the semiconductor wafer, utilizing the polish pad,
wherein utilizing the pad resurfacing arm comprises:
vertically rotating the pad resurfacing arm,
sliding the pad resurfacing arm on the polish pad, and
applying different levels of force to the polish pad from different locations of the pad resurfacing arm.

* * * * *